(12) United States Patent
Okada et al.

(10) Patent No.: US 11,631,645 B2
(45) Date of Patent: Apr. 18, 2023

(54) CIRCUIT MODULE AND MANUFACTURING METHOD THEREFOR

(71) Applicant: Murata Manufacturing Co., Ltd., Kyoto (JP)

(72) Inventors: Takahiro Okada, Kyoto (JP); Kazushige Sato, Kyoto (JP); Takafumi Kanno, Kyoto (JP); Nobumitsu Amachi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 86 days.

(21) Appl. No.: 16/662,615

(22) Filed: Oct. 24, 2019

(65) Prior Publication Data

US 2020/0058599 A1    Feb. 20, 2020

Related U.S. Application Data

(63) Continuation of application No. PCT/JP2018/015699, filed on Apr. 16, 2018.

(30) Foreign Application Priority Data

Apr. 28, 2017    (JP) .............................. JP2017-090400

(51) Int. Cl.
*H01L 23/552* (2006.01)
*H01L 23/31* (2006.01)
(Continued)

(52) U.S. Cl.
CPC ........ *H01L 23/552* (2013.01); *H01L 21/4853* (2013.01); *H01L 21/568* (2013.01);
(Continued)

(58) Field of Classification Search
CPC .... H01L 23/552; H01L 23/3121; H01L 23/31
See application file for complete search history.

(56) References Cited

U.S. PATENT DOCUMENTS

| 4,143,456 A | * | 3/1979 | Inoue | ...................... H01L 21/56 174/521 |
| 7,745,910 B1 | * | 6/2010 | Olson | .................. H01L 21/561 257/659 |

(Continued)

FOREIGN PATENT DOCUMENTS

| CN | 102779762 A | 11/2012 |
| JP | 2001-244688 A | 9/2001 |

(Continued)

OTHER PUBLICATIONS

Definition of "adjoining", https://dictionary.cambridge.org/us/dictionary/english/ (2021) (Year: 2021).*

(Continued)

*Primary Examiner* — Michele Fan
(74) *Attorney, Agent, or Firm* — Pearne & Gordon LLP

(57) ABSTRACT

A circuit module (101) includes a circuit board (1) having a main surface (1u), an electronic component (3) mounted on the main surface (1u), and a sealing resin (4) covering at least part of the electronic component (3) on the main surface (1u). A recess (7) is formed on at least part of a side surface (11) of the sealing resin (4). At least the recess (7) is covered with an electrically conductive film (6).

15 Claims, 5 Drawing Sheets

(51) Int. Cl.
*H01L 21/48* (2006.01)
*H01L 21/56* (2006.01)
*H01L 23/498* (2006.01)
*H01L 23/00* (2006.01)

(52) U.S. Cl.
CPC .... *H01L 23/3121* (2013.01); *H01L 23/49811* (2013.01); *H01L 24/16* (2013.01); *H01L 24/81* (2013.01); *H01L 24/97* (2013.01); *H01L 2224/16227* (2013.01); *H01L 2224/16238* (2013.01); *H01L 2924/3025* (2013.01); *H01L 2924/35121* (2013.01)

(56) References Cited

U.S. PATENT DOCUMENTS

| | | | | |
|---|---|---|---|---|
| 2007/0216023 | A1* | 9/2007 | Nakatani | B23K 1/0016 257/714 |
| 2010/0032815 | A1* | 2/2010 | An | H01L 23/3121 257/660 |
| 2011/0298111 | A1 | 12/2011 | Kim | |
| 2012/0286415 | A1* | 11/2012 | Sakai | H01L 21/78 257/734 |
| 2013/0294034 | A1* | 11/2013 | Kanryo | H05K 3/301 361/728 |
| 2014/0251670 | A1* | 9/2014 | Sakai | H05K 3/30 174/260 |
| 2018/0090449 | A1* | 3/2018 | Jeong | H01L 23/3157 |
| 2018/0286817 | A1* | 10/2018 | Kitazaki | H01L 21/56 |
| 2019/0067154 | A1* | 2/2019 | Yoshihara | H01L 21/56 |
| 2019/0295959 | A1* | 9/2019 | Ishida | H01L 21/4817 |
| 2020/0058599 | A1* | 2/2020 | Okada | H01G 4/224 |

FOREIGN PATENT DOCUMENTS

| | | |
|---|---|---|
| JP | 2011-258920 A | 12/2011 |
| JP | 2012204658 A * | 10/2012 |
| JP | 2012-256842 A | 12/2012 |
| WO | 2017/212965 A1 | 12/2017 |

OTHER PUBLICATIONS

International Search Report for International Application No. PCT/JP2018/015699 dated May 22, 2018.
Written Opinion for International Application No. PCT/JP2018/015699 dated May 22, 2018.

* cited by examiner

CIRCUIT MODULE AND MANUFACTURING METHOD THEREFOR

This is a continuation of International Application No. PCT/JP2018/015699 filed on Apr. 16, 2018 which claims priority from Japanese Patent Application No. 2017-090400 filed on Apr. 28, 2017. The contents of these applications are incorporated herein by reference in their entireties.

BACKGROUND OF THE DISCLOSURE

Field of the Disclosure

The present disclosure relates to a circuit module and a manufacturing method therefor.

Description of the Related Art

A so-called semiconductor package is described in Japanese Unexamined Patent Application Publication No. 2011-258920 (Patent Document 1). In Patent Document 1, the semiconductor package includes a substrate. An electronic component is mounted on the surface of the substrate. The electronic component is sealed by an electrically insulating molded portion. A cavity is formed on the side surface of the substrate. An electrode is formed in the cavity. An electrically conductive shield portion is formed to cover the outer surface of the molded portion so as to be electrically connected to the electrode formed in the cavity.

Patent Document 1: Japanese Unexamined Patent Application Publication No. 2011-258920

BRIEF SUMMARY OF THE DISCLOSURE

In the configuration described in Patent Document 1, the cavity, that is, the recess, is formed on the side surface of the substrate, and electrical connection between the electrode in the cavity and the shield portion is achieved. However, actually, about only one-type wire can be disposed in such a cavity. When a cavity is formed on the side surface of the substrate, the accuracy of the formation of the cavity is lower than the accuracy of the formation or positioning of a general wiring pattern. Therefore, the cavity and its surroundings need to be designed in dimensions with allowance, resulting in an increase in dead space in a region around the side surface of the substrate inside the substrate. This interferes with miniaturization of the circuit module. In addition, peeling of the shield portion that covers the outer surface of the molded portion is not sufficiently prevented.

It is an object of the present disclosure to provide a circuit module whose electrically conductive film that serves as a shield portion is hard to peel off and a manufacturing method therefor.

To achieve the above object, a circuit module based on the present disclosure includes a circuit board having a main surface, an electronic component mounted on the main surface, and a sealing resin covering at least part of the electronic component on the main surface. A recess is formed on at least a part of a side surface of the sealing resin. At least the recess is covered with an electrically conductive film.

According to the present disclosure, in a circuit module, the electrically conductive film that serves as a shield portion is hard to peel off.

DETAILED DESCRIPTION OF THE DISCLOSURE

Figure 1:
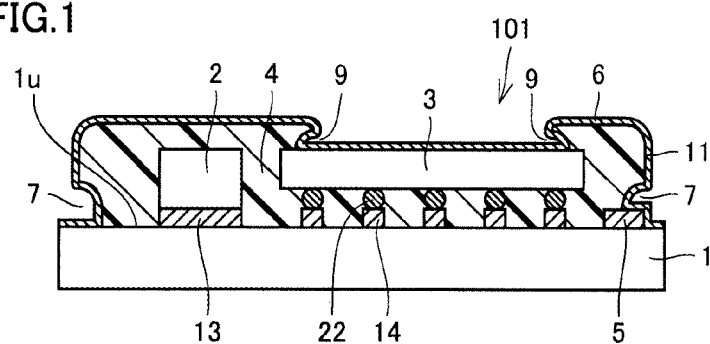
FIG. 1 is a cross-sectional view of a circuit module in a first embodiment based on the present disclosure.

Scale ratios in the drawings do not always truly show actual ratios, and scale ratios may be exaggerated for the sake of convenience of illustration. In the following description, when the concept of an upper side or lower side is referred to, it does not always mean an absolute upper side or absolute lower side and may mean a relatively upper side or relatively lower side in the illustrated positions.

First Embodiment

A circuit module in a first embodiment based on the present disclosure will be described with reference to FIG. 1 to FIG. 3. FIG. 1 shows the cross-sectional view of the circuit module in the present embodiment.

The circuit module 101 in the present embodiment includes a circuit board 1 having a main surface 1u, an electronic component 3 mounted on the main surface 1u, and a sealing resin 4 covering at least a part of the electronic component 3 on the main surface 1u. The sealing resin 4 covers at least a part of a joint between the main surface 1u and the electronic component 3. A recess 7 is formed on a side surface 11 of the sealing resin 4. The recess 7 is formed at a joint between the main surface 1u and the sealing resin 4. At least the recess 7 is covered with an electrically conductive film 6. The electrically conductive film 6 is provided to shield the components disposed inside the sealing resin 4 from the outside. Therefore, the electrically conductive film 6 covers almost the entire outer surface of the sealing resin 4. As shown in the present embodiment, the electrically conductive film 6 preferably covers the entire outer surface of the sealing resin 4.

The term "main surface" in this specification includes not only the main surface itself of the circuit board but also, for example, electrodes, a grounding wire, mounting lands, wiring pattern, and the like, on the main surface of the circuit board.

In the example shown here, an electronic component 2 other than the electronic component 3 is mounted on the main surface 1u. Electrodes 13, 14 are disposed on the main surface 1u. The electronic component 2 is mounted on the electrode 13. The electronic component 3 includes a plurality of ball electrodes 22 on its bottom surface. The ball electrodes 22 each are electrically connected to the electrode 14. In the example shown here, a grounding wire 5 is also disposed on the main surface 1u. The electronic component 2 is completely covered with the sealing resin 4. The electronic component 3 is partially covered with the sealing resin 4. A part of the top surface of the electronic component 3 is not covered with the sealing resin 4.

Figure 2:
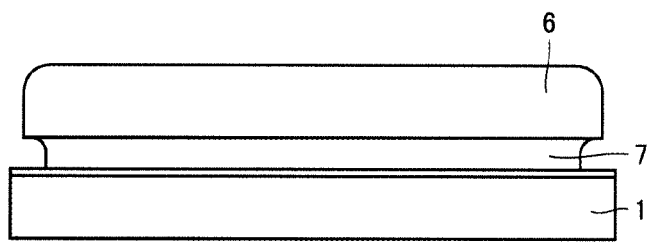
FIG. 2 is a side view of the circuit module in the first embodiment based on the present disclosure.
Figure 3:
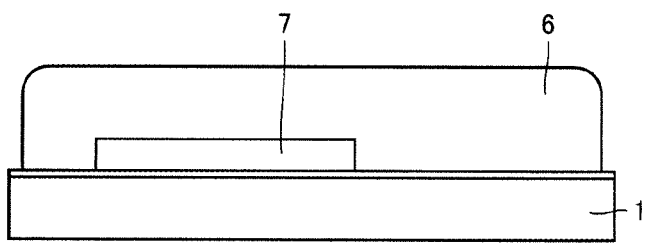
FIG. 3 is a side view of a modification of the circuit module in the first embodiment based on the present disclosure.

FIG. 2 shows the circuit module 101 when viewed from the left side in FIG. 1. The electrically conductive film 6 that covers the sealing resin 4 is seen. The recess 7 is provided so as to connect one side of the circuit module from end to end in this way. The recess 7 is not always provided over the entire one side as shown in FIG. 2. The recess 7 may be provided only a part of one side as shown in FIG. 3.

Here, although the internal structure of the circuit board 1 is not shown, wires may be formed as needed inside the circuit board 1. A component may be incorporated in the circuit board 1. An outer electrode may be disposed on the bottom surface of the circuit board 1.

In the present embodiment, the electrically conductive film 6 is formed along the shape of the recess 7, so the thickness of the electrically conductive film 6 itself tends to increase at this portion, with the result that the electrically conductive film 6 is hard to peel off. In the present embodiment, since the recess 7 is formed on the side surface 11 of the sealing resin 4, no recess needs to be formed on the side surface of the circuit board 1. In the present embodiment, since the recess 7 is covered with the electrically conductive film 6, the desired electrical connection with the electrically conductive film 6 is provided by using the recess 7. In the example shown in FIG. 1, at the right-side recess 7, the electrically conductive film 6 and the grounding wire 5 are electrically connected. In the present embodiment, without any dead space in a region around the side surface of the circuit board 1 inside the circuit board 1, the connection of the desired wire with the electrically conductive film 6 that serves as a shield portion is favorably ensured.

Alternatively, not only the electrically conductive film 6 is formed along the shape of the recess 7 but also, for example, the electrically conductive film 6 may be formed to fill the entire recess 7. In this case, the electrically conductive film 6 is shaped so as to be entered into the sealing resin 4 by the recess 7, so the undesirable peeling of the electrically conductive film 6 off from the sealing resin 4 is further reliably prevented.

The circuit module 101 in the present embodiment may be, for example, a wireless LAN module in which a transceiver IC for wireless LAN and peripheral components are mounted on a so-called printed circuit board.

At the right side of FIG. 1, the grounding wire 5 is exposed to the inside of the recess 7; however, this configuration is only illustrative. A wire that is exposed to the inside of the recess 7 may be a wire of a type other than the grounding wire 5. As shown at the left side in FIG. 1, no wire may be exposed to the recess 7. At the left-side recess 7 in FIG. 1, the recess 7 is covered with the electrically conductive film 6; however, the electrically conductive film 6 and another wire are not connected at this portion. The recess 7 may be not only provided at a position close to the circuit board 1 on the side surface of the sealing resin 4 as shown in FIG. 1 but also provided at a position away upward from the circuit board 1 on the side surface of the sealing resin 4.

As described in the present embodiment, preferably, the grounding wire 5 is disposed on the main surface 1u, and the electrically conductive film 6 is connected to the grounding wire 5 inside the recess 7. When this configuration is employed, the electrically conductive film 6 and the grounding wire 5 are stably connected by using the inside of the recess 7. The electrically conductive film 6 and the grounding wire 5 are connected with a certain amount of area, so the connection resistance is reduced even with a thin wire.

As described in the present embodiment, a part of the main surface 1u or a part of the electronic component 3 is preferably not covered with the sealing resin 4 but covered with the electrically conductive film 6. In the example described in the present embodiment, a part of the electronic component 3 is not covered with the sealing resin 4 but covered with the electrically conductive film 6. When this configuration is employed, the heat that is generated from the electronic component 3 is quickly radiated through the electrically conductive film 6. Generally, as a communication speed increases, the amount of the heat generated by a transceiver IC tends to remarkably increase, and it is sought to improve the heat radiation performance. When the electronic component 3 is a transceiver IC, the heat radiation performance is improved when this configuration is employed, so the electronic component 3 can also support a high communication speed.

At a portion at which the top surface of the electronic component 3 and the electrically conductive film 6 are in contact with, thermal stress repeatedly acts, so the connection reliability is a matter of concern. As described in the present embodiment, preferably, a recess 9 is provided in the sealing resin 4 at a portion at which the top surface of the electronic component 3 and the electrically conductive film 6 are in contact with. When this configuration is employed, the connection reliability is increased. The recess 9 may be buried in the electrically conductive film 6. The recess 9 is not essential.

As illustrated in the present embodiment, the electronic component 2 completely covered with the sealing resin 4 and the electronic component 3 having a region not covered with the sealing resin 4 may be mixed. The electronic component 2 is not essential.

In the present embodiment, the shape of the recess 7 in cross-sectional view is shown such that the bottom side is straight and the top side is circular arc. In other words, the recess 7 is shown in a shape like a quarter circle. However, this is only schematically shown, and actually the recess 7 is not limited to the shape like a quarter circle. The top side is not limited to a circular arc shape. The recess 7 may be, for example, a rectangular shape or a trapezoidal shape in cross-sectional view.

Second Embodiment

Figure 4:
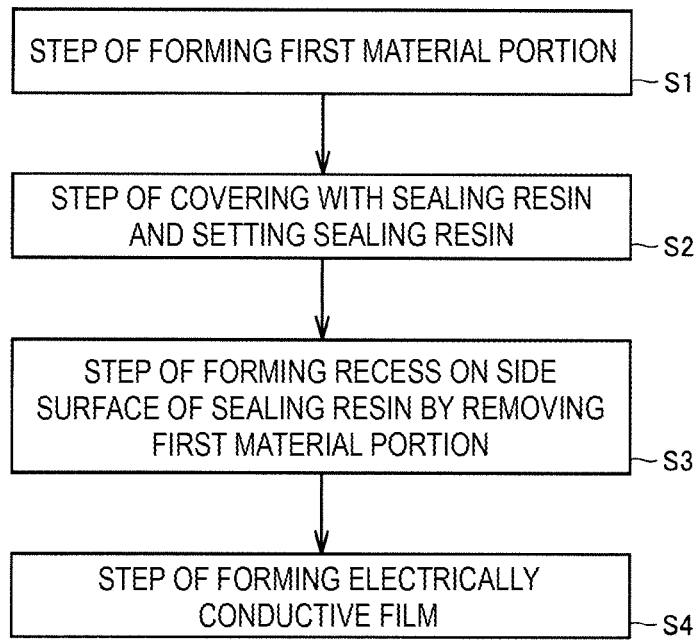
FIG. 4 is a flowchart of a manufacturing method for a circuit module in a second embodiment based on the present disclosure.

A manufacturing method for a circuit module in a second embodiment based on the present disclosure will be described with reference to FIG. 4. FIG. 4 shows a flowchart of the manufacturing method for a circuit module in the present embodiment.

The manufacturing method for a circuit module in the present embodiment includes a step S1 of forming a first material portion by using a material, having a property of repelling a sealing resin, on a surface of at least any one of a part of a main surface of a circuit board and a part of a wire disposed on the main surface, an electronic component being mounted on the main surface of the circuit board, a step S2 of covering the main surface with a liquid sealing resin and setting the sealing resin such that at least part of the electronic component is covered and the first material portion is partially covered, a step S3 of forming a recess on a side surface of the sealing resin at a position adjoining a joint between the circuit board and the sealing resin by removing the first material portion, and a step S4 of forming an electrically conductive film such that at least the recess is covered.

Figure 5:
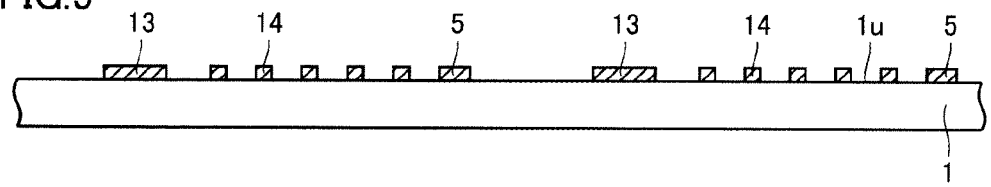
FIG. 5 is a view that illustrates a first process of the manufacturing method for a circuit module in the second embodiment based on the present disclosure.

The steps will be described in detail below. First, as shown in FIG. 5, circuit boards 1 in a collective board state are prepared. Grounding wires 5 and electrodes 13, 14 are formed on the main surfaces 1u of the circuit boards 1.

Figure 6:
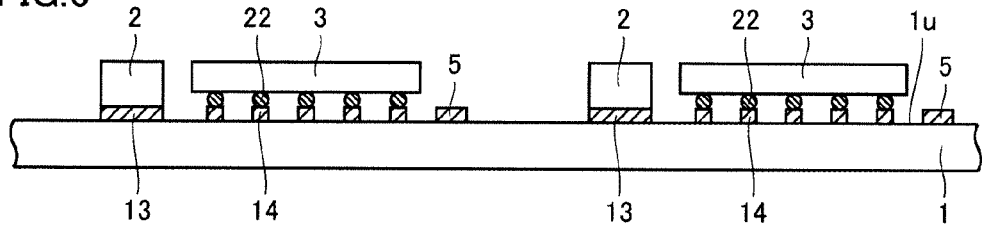
FIG. 6 is a view that illustrates a second process of the manufacturing method for a circuit module in the second embodiment based on the present disclosure.

As shown in FIG. 6, electronic components 2 are mounted by using the electrodes 13. Electronic components 3 are mounted by using the electrodes 14.

Figure 7:
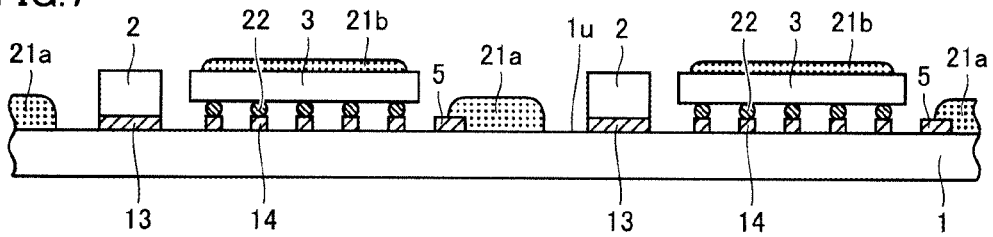
FIG. 7 is a view that illustrates a third process of the manufacturing method for a circuit module in the second embodiment based on the present disclosure.

In step S1, as shown in FIG. 7, first material portions 21a are formed by using a material, having a property of repelling a sealing resin, on surfaces of at least any one of parts of main surfaces 1u of the circuit boards 1 and parts of wires mounted on the main surfaces 1u, the electronic components 2, 3 being mounted on the main surfaces 1u of the circuit boards 1. At this time, other than the first material portions 21a, first material portions 21b may be formed so as to cover parts of the top surfaces of the electronic components 3. The first material portions 21b may also be made of the same material as the first material portions 21a. The "material having a property of repelling a sealing resin" is, for example, a silicone resin.

Specifically, after the electronic components 2, 3 are mounted on the main surfaces 1u of the circuit boards 1 by soldering, a liquid silicone resin may be applied by a dispenser. In applying a liquid silicone resin, a method, such as ink-jet printing, may be employed instead of using a dispenser. The temperature is raised after the application. At this time, the temperature may be raised to, for example, 120° C. Thus, the silicone resin sets.

Figure 8:
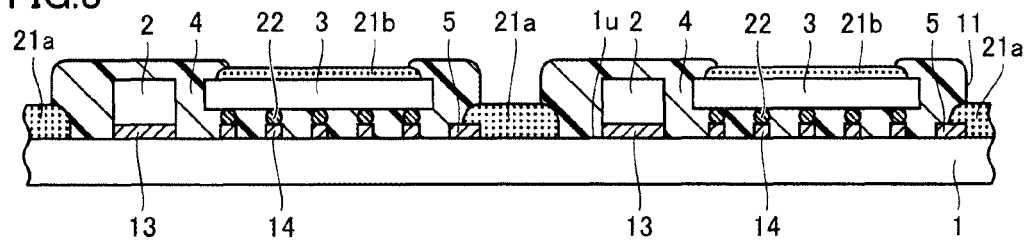
FIG. 8 is a view that illustrates a fourth process of the manufacturing method for a circuit module in the second embodiment based on the present disclosure.

In step S2, sealing resins 4 are formed as shown in FIG. 8. The sealing resins 4 may be, for example, epoxy liquid resin. The liquid resin for the material of the sealing resins 4 is repelling by the first material portions 21a, 21b. The sealing resins 4 are formed partially over the first material portions 21a, 21b. The liquid resin for the material of the sealing resins 4 is set by raising the temperature after the application. At this time, the temperature may be raised to, for example, 150° C.

Figure 9:
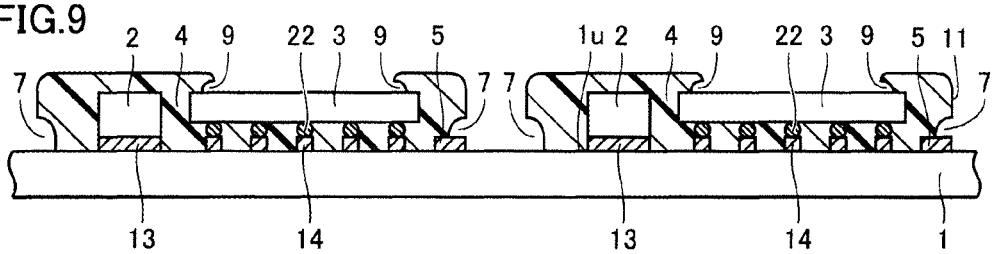
FIG. 9 is a view that illustrates a fifth process of the manufacturing method for a circuit module in the second embodiment based on the present disclosure.

In step S3, recesses 7 are formed on side surfaces 11 of the sealing resins 4 at positions adjoining joints between the circuit boards 1 and the sealing resins 4 as shown in FIG. 9 by removing the first material portions 21a. At this time, the first material portions 21b are also removed at the same time, and recesses 9 are formed. The recesses 9 are recessed laterally at the portions of the sealing resins 4 formed over the top surfaces of the electronic components 3. When the recesses 9 are formed, regions where the top surfaces of the electronic components 3 are exposed are expanded. To remove the first material portions 21a, 21b, the first material portions 21a, 21b just need to be subjected to a process of degreasing and cleaning after dissolving with a silicone dissolver. The process of degreasing and cleaning may serve as a pre-process of forming an electrically conductive film 6, which is to be performed in step S4 after this.

Figure 10:
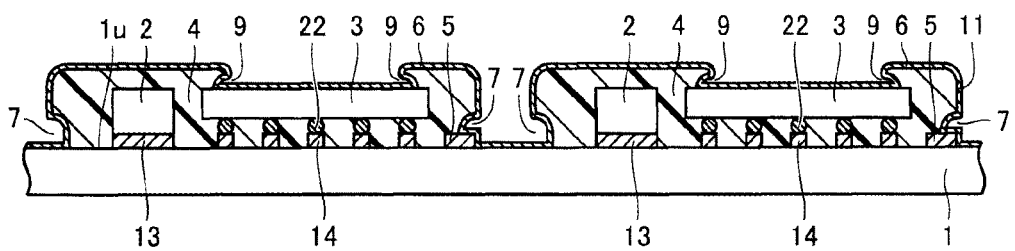
FIG. 10 is a view that illustrates a sixth process of the manufacturing method for a circuit module in the second embodiment based on the present disclosure.

In step S4, the electrically conductive film 6 is formed as shown in FIG. 10. The electrically conductive film 6 may be formed by, for example, applying silver paste.

Figure 11:
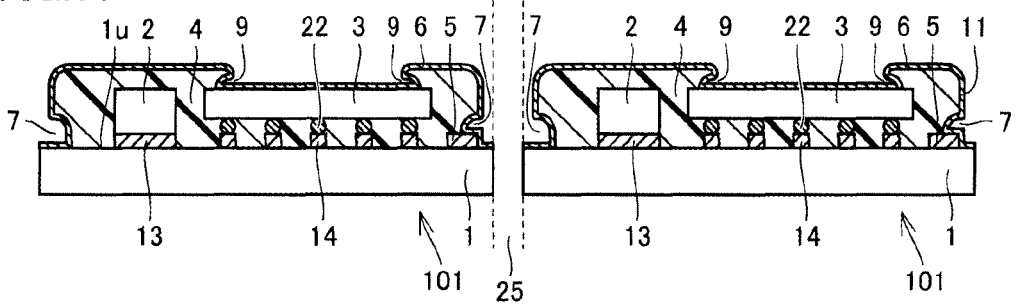
FIG. 11 is a view that illustrates a seventh process of the manufacturing method for a circuit module in the second embodiment based on the present disclosure.

As shown in FIG. 11, the circuit modules are singulated by cutting them with a dicing machine. As a result of removal of a region 25 by cutting them with a dicing machine, a plurality of circuit modules is obtained from the collective board. In this way, the circuit module 101 shown in FIG. 1 is obtained.

A fluororesin instead of a silicone resin may also be used as the "material having a property of repelling a sealing resin".

In the present embodiment, the circuit module as described in the first embodiment can be easily obtained. In the thus obtained circuit module, without any dead space in a region around the side surface of the circuit board 1 inside the circuit board 1, connection of a desired wire with the electrically conductive film 6 that serves as a shield portion is favorably ensured.

In the present embodiment, without performing any special shaving step for the sealing resins 4, the recesses 7 are formed on the side surfaces 11 of the sealing resins 4. Therefore, yield improves, and manufacturing cost is reduced.

In the example described in the present embodiment, wires connected to a ground potential, that is, the grounding wires 5, are disposed along dicing lines. The wires are covered with the first material portions 21a in step S1 before the sealing resins 4 are formed in step S2, so the grounding wires 5 are directly exposed when the first material portions 21a are removed in step S3. Therefore, in forming the electrically conductive films 6 in step S4, the electrically conductive films 6 and the grounding wires 5 are in direct plane contact with each other, so both are stably electrically connected.

As illustrated in the present embodiment, in step S1 of forming first material portions, the first material portions 21b may be formed so as to cover the surfaces of parts of the electronic components 3 (see FIG. 7). By doing so, the sealing resins 4 are formed over end portions of the first material portions 21b in step S2 (see FIG. 8), and recesses 9 are formed by removing the first material portions 21b in step S3 (see FIG. 9). By doing so, the area of regions in which the top surfaces of the electronic components 3 directly come in contact with the electrically conductive films 6 is increased, so the heat that is generated from the electronic components 3 is further efficiently transferred to the electrically conductive films 6. Thus, the heat radiation is efficiently performed.

Third Embodiment

Figure 12:
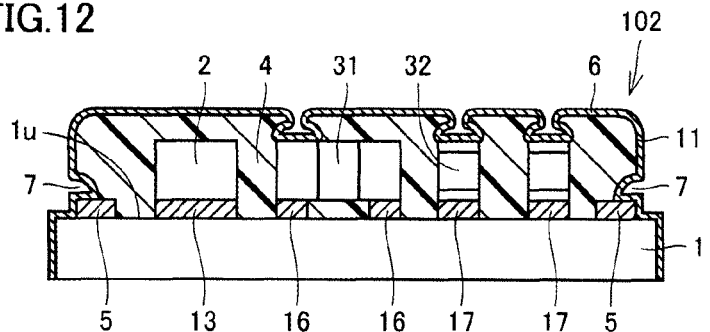
FIG. 12 is a cross-sectional view of a circuit module in a third embodiment based on the present disclosure.

A circuit module in a third embodiment based on the present disclosure will be described with reference to FIG. 12. FIG. 12 shows the cross-sectional view of the circuit module in the present embodiment.

The circuit module 102 in the present embodiment includes the circuit board 1 having the main surface 1u, the electronic component 2 mounted on the main surface 1u, electronic components 31, 32 mounted on the main surface 1u, and the sealing resin 4 that covers at least parts of the electronic components 2, 31, 32 on the main surface 1u. The recess 7 is formed on at least part of the side surface 11 of the sealing resin 4. At least the recess 7 is covered with the electrically conductive film 6. In the example shown here, the electronic components 2, 31, 32 are mounted on the main surface 1u. The electronic components 31, 32 may be, for example, capacitors. The electronic components 31, 32 may be, for example, multilayer ceramic capacitors. The electronic components 31, 32 each include terminal electrodes. At least parts of the terminal electrodes are not covered with the sealing resin 4 but covered with the electrically conductive film 6.

For example, as shown in FIG. 12, the electronic component 31 has terminal electrodes at both right and left ends. The electronic component 31 is mounted such that these two terminal electrodes are connected to electrodes 16 of the circuit board 1. One of the two terminal electrodes of the electronic component 31 has a region not covered with the sealing resin 4. In this region, the electrically conductive film 6 directly comes in contact with the terminal electrode of the electronic component 31.

For example, as shown in FIG. 12, the electronic component 32 has terminal electrodes at both top and bottom ends. The electronic component 32 is mounted such that, of these two terminal electrodes, the terminal electrode at the bottom end is connected to an electrode 17 of the circuit board 1. The terminal electrode at the top end of the electronic component 32 has a region not covered with the sealing resin 4. In this region, the electrically conductive film 6 directly comes in contact with the terminal electrode at the top end of the electronic component 32.

In the present embodiment as well, similar advantageous effects to those of the first embodiment are obtained. In the present embodiment, the electrically conductive film 6 is directly connected to the terminal electrodes of the individual electronic components 31, 32, so the same potential as that of the electrically conductive film 6 can be applied to the terminal electrodes. When the electrically conductive film 6 is connected to the grounding wire 5, the terminal electrodes of the electronic components 31, 32 are grounded via the electrically conductive film 6 disposed in this way.

Fourth Embodiment

A manufacturing method for a circuit module in a fourth embodiment based on the present disclosure will be described with reference to FIG. 13.

Figure 13:
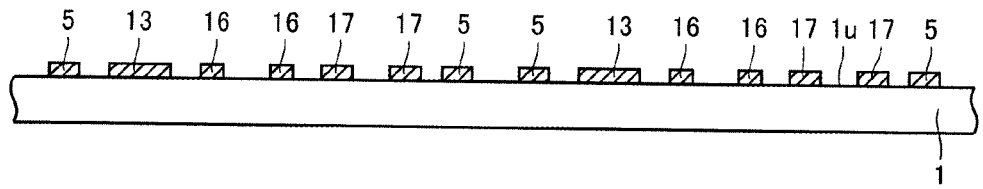
FIG. 13 is a view that illustrates a first process of the manufacturing method for a circuit module in a fourth embodiment based on the present disclosure.

First, as shown in FIG. 13, circuit boards 1 in a collective board state are prepared. Grounding wires 5 and electrodes 13, 16, 17 are formed on main surfaces 1u of the circuit boards 1.

Figure 14:
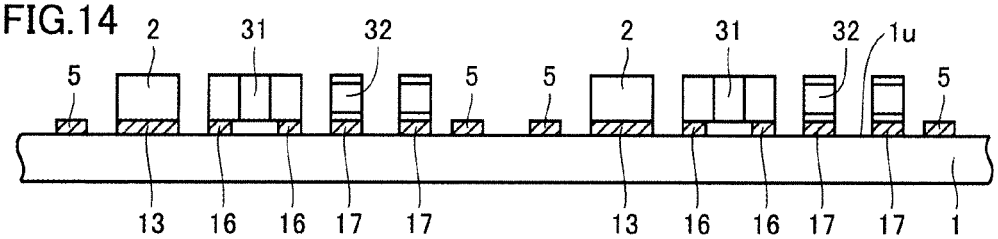
FIG. 14 is a view that illustrates a second process of the manufacturing method for a circuit module in the fourth embodiment based on the present disclosure.

As shown in FIG. 14, electronic components 2 are mounted by using the electrodes 13. Electronic components 31 are mounted by using the electrodes 16. Electronic components 32 are mounted by using the electrodes 17. In the example shown here, the electronic components 31 are mounted in a horizontally oriented position, and the electronic components 32 are mounted in a vertically oriented position.

Figure 15:
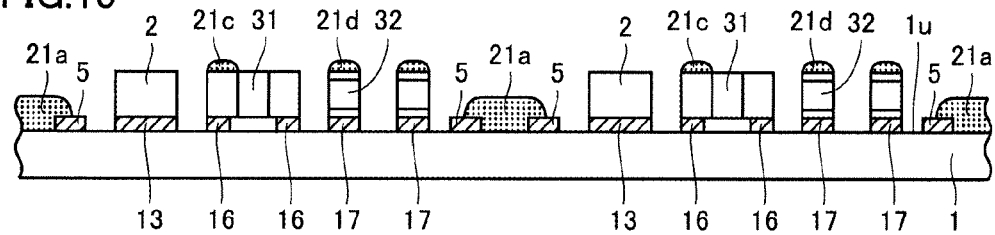
FIG. 15 is a view that illustrates a third process of the manufacturing method for a circuit module in the fourth embodiment based on the present disclosure.

In step S1, as shown in FIG. 15, first material portions 21 are formed by using a material, having a property of repelling a sealing resin, on surfaces of at least any one of parts of main surfaces 1u of the circuit boards 1 and parts of wires mounted on the main surfaces 1u, the electronic components 2, 3 being mounted on the main surfaces 1u of the circuit boards 1. At this time, other than the first material portions 21a, first material portions 21c may be formed so as to cover parts of the top surfaces of the electronic components 31. First material portions 21d may be formed so as to cover parts of the top surfaces of the electronic components 32. The first material portions 21c, 21d may also be made of the same material as the first material portions 21a. The details of the type of "the material having a property of repelling a sealing resin" and application method for the material are similar to those described in the second embodiment.

Figure 16:
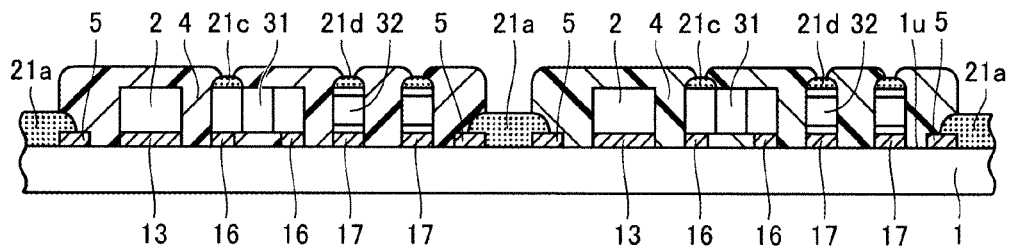
FIG. 16 is a view that illustrates a fourth process of the manufacturing method for a circuit module in the fourth embodiment based on the present disclosure.

In step S2, sealing resins 4 are formed as shown in FIG. 16. The details of the sealing resins 4 are similar to those described in the second embodiment.

Figure 17:
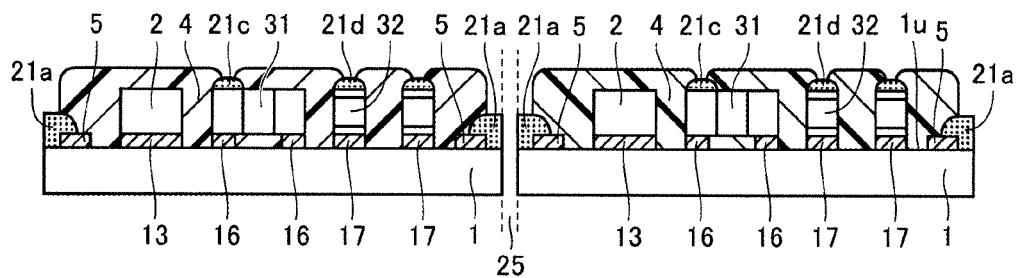
FIG. 17 is a view that illustrates a fifth process of the manufacturing method for a circuit module in the fourth embodiment based on the present disclosure.
Figure 18:
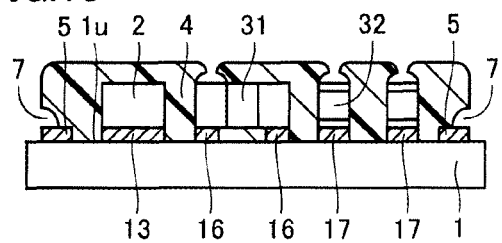
FIG. 18 is a view that illustrates a sixth process of the manufacturing method for a circuit module in the fourth embodiment based on the present disclosure.

As shown in FIG. 17, the circuit modules are singulated by cutting them with a dicing machine. As a result of removal of a region 25 by cutting them with a dicing machine, a plurality of circuit modules is obtained from the collective board. In this way, the structure shown in FIG. 18 is obtained. In addition, an electrically conductive film 6 is formed in step S4. A method of forming the electrically conductive film 6 is similar to that described in the second embodiment. In this way, the circuit module 102 shown in FIG. 12 is obtained. In the present embodiment, since step S4 is performed after the singulation, the electrically conductive film 6 can be formed so as to cover the side surfaces of the circuit boards 1. The electrically conductive film 6 may reach the bottom ends of the side surfaces of the circuit boards 1.

As described in the present embodiment, preferably, the electrically conductive film 6 extends so as to cover the side surfaces of the circuit boards 1. When this configuration is employed, shielding performance is increased. In the first embodiment, the side surface of the circuit board 1 is not covered with the electrically conductive film 6; however, in the first embodiment as well, the side surface of the circuit board 1 may be covered with the electrically conductive film 6 as in the case of the present embodiment. Whether the electrically conductive film 6 covers up to the side surface of the circuit board 1 may be selected as needed depending on whether any one of the formation of the electrically conductive film 6 and cutting with a dicing machine for singulating the collective board is performed first.

In the present embodiment, the circuit module as described in the third embodiment can be easily obtained.

In the above-described embodiments, some electronic components are illustrated; however, the type, shape, size, number, position, orientation, and the like, of each electronic component to be mounted on the circuit board 1 are only illustrative for the sake of convenience of illustration, and are not restrictive to those.

A combination of some of the above-described embodiments may be employed as needed. The embodiments described above are illustrative in all respects and not restrictive. The scope of the present disclosure is recited in the appended claims. The present disclosure encompasses all modifications within the meaning and scope of equivalents of the scope of the claims.

1 circuit board
1u main surface
2, 3 electronic component
4 sealing resin
5 grounding wire
6 electrically conductive film
7, 9 recess
11 side surface
13, 14, 16, 17 electrode
21a, 21b, 21c, 21d first material portion
22 ball electrode
23 terminal electrode
25 region (removed by cutting)
31, 32 electronic component
101, 102 circuit module

What is claimed is:

1. A circuit module comprising:
 a circuit board having a main surface;
 an electronic component mounted on the main surface;
 a sealing resin covering at least a part of a first joint disposed on the main surface and adjacent to the electronic component, the first joint including a region between the main surface and the electronic component; and
 a recess is provided on a side surface of the sealing resin at a position adjoining a second joint, the second joint including an intersection between the sealing resin and the main surface, wherein
 at least the recess is covered with an electrically conductive film, and
 the recess does not extend to the top of the sealing resin.

2. The circuit module according to claim 1, wherein the recess is further provided into the side surface of the sealing resin.

3. The circuit module according to claim 1, further comprising:
 another recess that is disposed above the electronic component.

4. The circuit module according to claim 1, further comprising a grounding wire disposed on the main surface, wherein the electrically conductive film is connected to the grounding wire inside the recess.

5. A manufacturing method for the circuit module according to claim 4, the manufacturing method comprising:
 a step of mounting the electronic component and the grounding wire on the main surface of the circuit board;
 a step of forming a first material portion on a surface of at least any one of a part of the main surface of the circuit board and a part of the grounding wire disposed on the main surface, wherein the first material portion is formed by using a material having a property of repelling the sealing resin;
 a step of covering the main surface with the sealing resin and setting the sealing resin so as to cover at least a part of the electronic component and partially cover the first material portion;
 a step of forming the recess on the side surface of the sealing resin at the position adjoining the second joint between the circuit board and the sealing resin by removing the first material portion; and
 a step of forming the electrically conductive film so as to cover at least the recess.

6. The manufacturing method for a circuit module according to claim 5, wherein, in the step of forming the first material portion, the first material portion is formed so as to cover a surface of a part of the electronic component.

7. The circuit module according to claim 4, wherein a part of the main surface or a part of the electronic component is not covered with the sealing resin but is covered with the electrically conductive film.

8. The circuit module according to claim 4, wherein
 the electronic component includes a terminal electrode, and
 at least a part of the terminal electrode is not covered with the sealing resin but covered with the electrically conductive film.

9. The circuit module according to claim 4, wherein the electrically conductive film extends so as to cover a side surface of the circuit board.

10. The circuit module according to claim 1, wherein a part of the main surface or a part of the electronic component is not covered with the sealing resin but is covered with the electrically conductive film.

11. The circuit module according to claim 10, wherein
 the electronic component includes a terminal electrode, and
 at least a part of the terminal electrode is not covered with the sealing resin but covered with the electrically conductive film.

12. The circuit module according to claim 10, wherein the electrically conductive film extends so as to cover a side surface of the circuit board.

13. The circuit module according to claim 1, wherein
 the electronic component includes a terminal electrode, and
 at least a part of the terminal electrode is not covered with the sealing resin but covered with the electrically conductive film.

14. The circuit module according to claim 13, wherein the electrically conductive film extends so as to cover a side surface of the circuit board.

15. The circuit module according to claim 1, wherein the electrically conductive film extends so as to cover a side surface of the circuit board.

* * * * *